United States Patent
Kang et al.

(10) Patent No.: US 10,566,573 B2
(45) Date of Patent: *Feb. 18, 2020

(54) ORGANIC LIGHT EMITTING DISPLAY APPARATUS AND METHOD OF MANUFACTURING ORGANIC LIGHT EMITTING DISPLAY APPARATUS

(71) Applicant: Samsung Display Co., Ltd., Yongin-si (KR)

(72) Inventors: Tae-Wook Kang, Yongin-si (KR); Dong-Won Han, Yongin-si (KR); Young-Seo Choi, Yongin-si (KR); Jin-Ho Kwack, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/381,035

(22) Filed: Apr. 11, 2019

(65) Prior Publication Data

US 2019/0237705 A1    Aug. 1, 2019

Related U.S. Application Data

(63) Continuation of application No. 15/342,938, filed on Nov. 3, 2016, now Pat. No. 10,297,790, which is a (Continued)

(30) Foreign Application Priority Data

Jan. 16, 2012    (KR) .................. 10-2012-0004914

(51) Int. Cl.
*H01L 51/52*    (2006.01)
*H01L 51/56*    (2006.01)

(52) U.S. Cl.
CPC .......... *H01L 51/5256* (2013.01); *H01L 51/56* (2013.01); *H01L 2251/301* (2013.01); *H01L 2251/303* (2013.01)

(58) Field of Classification Search
CPC ......... H01L 2251/301; H01L 2251/303; H01L 51/5256; H01L 51/56; H01L 51/5253;
(Continued)

(56) References Cited

U.S. PATENT DOCUMENTS 7,510,913 B2    3/2009    Moro et al.
7,648,925 B2    1/2010    Moro et al.
(Continued)

FOREIGN PATENT DOCUMENTS

KR    10-0730220    6/2007
KR    10-2010-0106796    10/2010

OTHER PUBLICATIONS

Non-Final Office Action dated Apr. 4, 2018 in U.S. Appl. No. 15/342,938.
(Continued)

*Primary Examiner* — Bao Q Truong
*Assistant Examiner* — Zachary J Snyder
(74) *Attorney, Agent, or Firm* — H.C. Park & Associates, PLC

(57) ABSTRACT

An organic light emitting display apparatus including a substrate, an organic light emitting portion comprising a plurality of organic light emitting devices formed on the substrate, and an encapsulation portion for encapsulating the organic light emitting portion. The encapsulation portion includes a porous layer formed on the organic light emitting portion, a planarization layer formed on the porous layer, and a barrier layer formed on the planarization layer. The porous layer prevents impurities from being concentrated at a part of the porous layer.

25 Claims, 3 Drawing Sheets

Related U.S. Application Data continuation of application No. 13/593,255, filed on Aug. 23, 2012, now Pat. No. 9,490,450.

(58) Field of Classification Search
CPC . H01L 51/5237; H01L 51/524; H01L 51/448; H01L 51/107
See application file for complete search history.

(56) References Cited

U.S. PATENT DOCUMENTS

| | | |
|---|---|---|
| 2002/0125822 A1 | 9/2002 | Graff et al. |
| 2003/0203210 A1 | 10/2003 | Graff et al. |
| 2007/0049155 A1 | 3/2007 | Moro et al. |
| 2007/0132381 A1 | 6/2007 | Hayashi et al. |
| 2007/0145895 A1 | 6/2007 | Yamamoto et al. |
| 2009/0208754 A1 | 8/2009 | Chu et al. |
| 2009/0278277 A1 | 11/2009 | Gong et al. |
| 2010/0244057 A1 | 9/2010 | Ryu et al. |
| 2011/0062603 A1 | 3/2011 | Hawker et al. |

OTHER PUBLICATIONS

Notice of Allowance dated Jan. 9, 2019 in U.S. Appl. No. 15/342,938.

ORGANIC LIGHT EMITTING DISPLAY APPARATUS AND METHOD OF MANUFACTURING ORGANIC LIGHT EMITTING DISPLAY APPARATUS

CROSS-REFERENCE TO RELATED APPLICATIONS

This application is a continuation of U.S. patent application Ser. No. 15/342,938, filed Nov. 3, 2016, which is a continuation of U.S. patent application Ser. No. 13/593,255, filed Aug. 23, 2012, now U.S. Pat. No. 9,490,450, issued on Nov. 8, 2016, each of which makes reference to, incorporates the same herein, and claims all benefits accruing under 35 U.S.C. § 119 from an application earlier filed in the Korean Intellectual Property Office on the 16 Jan. 2012 and there duly assigned Serial No. 10-2012-0004914.

BACKGROUND OF THE INVENTION

Field of the Invention

The present invention relates to an organic light emitting display apparatus, and more particularly, to a method of manufacturing an organic light emitting display apparatus.

Description of the Related Art

Organic light emitting display apparatuses using an organic light emitting device are widely accepted as a next generation display apparatus due to their fast response speed that enables smooth display of a motion picture and their self-light emitting characteristic that provides a wide view angle and a high brightness, compared to liquid crystal display (LCD) devices that are currently widely used.

An organic light emitting device includes a pixel electrode and an opposed electrode, which are arranged to face each other, and a light emitting layer including an organic material provided between the pixel electrode and the opposed electrode. The organic light emitting device is very sensitive to moisture, oxygen, light, etc. Thus, when contacted by these elements, the organic light emitting device may be easily degraded. Also, when moisture, oxygen, etc. intrude and diffuse into an organic layer, an electrochemical charge transfer reaction occurs at a boundary surface between an electrode and the organic layer so that an oxide is generated. The oxide separates the organic layer and the pixel electrode or the opposed electrode, causing a phenomenon such as a dark spot so that the life of the organic light emitting device may be reduced. The organic light emitting device exhibits a weak resistance to heat, and thus, the life of the organic light emitting device is reduced by about 20 times when the temperature rises to 30° C. to 60° C. Thus, encapsulation technology to prevent external moisture, oxygen, light, etc. from intruding into the organic light emitting device is commonly used in the organic light emitting device.

SUMMARY OF THE INVENTION

The present invention provides an organic light emitting display apparatus capable of delaying revelation of progressive dark spots so as to extend the life of the organic light emitting display apparatus, and a method of manufacturing the organic light emitting display apparatus.

According to an aspect of the present invention, an organic light emitting display apparatus includes a substrate, an organic light emitting portion comprising a plurality of organic light emitting devices formed on the substrate, and an encapsulation portion for encapsulating the organic light emitting portion. The encapsulation portion includes a porous layer formed on the organic light emitting portion, a planarization layer formed on the porous layer, and a barrier layer formed on the planarization layer. The porous layer prevents impurities from being concentrated at a part of the porous layer.

The porous layer may prevent impurities, intruding into the porous layer, from being concentrated at a part of the porous layer by diffusing the impurities into the porous layer.

The porous layer may have a path through which the impurities move so as to be evenly diffused into the porous layer without being concentrated at a part of the porous layer.

The impurities may be generated from the planarization layer or may intrude from the outside of the organic light emitting apparatus, and may degrade the organic light emitting device.

The impurities may be oxygen or moisture generated from the planarization layer or the outside of the organic light emitting apparatus.

The planarization layer may be formed of an organic material.

The barrier layer may be formed of an inorganic material.

The barrier layer may be formed of $AlO_x$, $Al_2O_3$, $SiN_x$, $Si_3N_4$, ZnO, ZrO, or Al-doped zinc oxide (AZO).

The barrier layer may be formed as two or more layers.

The porous layer may be formed as a single layer.

The porous layer may be formed of LiF.

The porous layer may include a first porous layer and a second porous layer that are stacked above the organic light emitting portion.

The first porous layer may be formed of LiF.

The second porous layer may be formed of $AlO_x$.

At least one planarization layer and at least one barrier layer are alternately stacked above the porous layer.

The organic light emitting device may include a first electrode formed on the substrate, an intermediate layer formed on the first electrode and emitting light, and a second electrode formed so as to cover the intermediate layer.

According to another aspect of the present invention, a method of manufacturing an organic light emitting display apparatus includes forming an organic light emitting device on a substrate, forming a porous layer on the organic light emitting device, forming a planarization layer on the porous layer, and forming a barrier layer on the planarization layer.

The porous layer may prevent impurities intruding into the porous layer from being concentrated at a part of the porous layer by diffusing the impurities into the porous layer.

The porous layer may have a path through which the impurities move so as to be evenly diffused into the porous layer without being concentrated at a part of the porous layer.

The impurities may be oxygen or moisture generated from the planarization layer or intruding from the outside of the organic light emitting apparatus.

The impurities may degrade the organic light emitting device.

The planarization layer may be formed of an organic material.

The barrier layer may be formed of an inorganic material.

The barrier layer may be formed of $AlO_x$, $Al_2O_3$, $SiN_x$, $Si_3N_4$, ZnO, ZrO, or Al-doped zinc oxide (AZO).

The barrier layer may be formed as two or more layers.

The porous layer may be formed as a single layer.

The porous layer may be formed of LiF.

The porous layer may include a first porous layer and a second porous layer that are stacked above the organic light emitting portion.

The first porous layer may be formed of LiF.

The second porous layer may be formed of $AlO_x$.

The forming of the organic light emitting device may include forming a first electrode on the substrate, forming an intermediate layer for emitting light on the first electrode, and forming a second electrode covering the intermediate layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
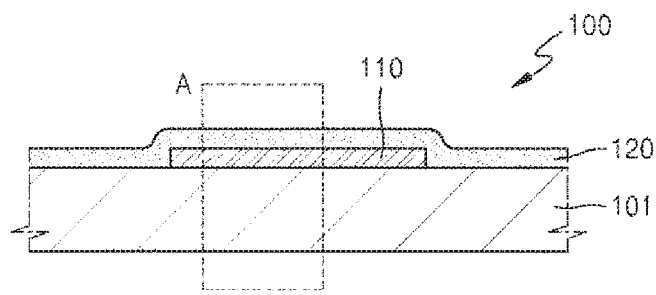
FIG. 1 is a cross-sectional view schematically illustrating an organic light emitting display apparatus according to an embodiment of the present invention.

The attached drawings for illustrating exemplary embodiments of the present invention are referred to in order to gain a sufficient understanding of the present invention, the merits thereof, and the objectives accomplished by the implementation of the present invention. Hereinafter, the present invention will be described in detail by explaining exemplary embodiments of the invention with reference to the attached drawings. Like reference numerals in the drawings denote like elements.

As used herein, the term "and/or" includes any and all combinations of one or more of the associated listed items. Expressions such as "at least one of," when preceding a list of elements, modify the entire list of elements and do not modify the individual elements of the list.

Figure 2:
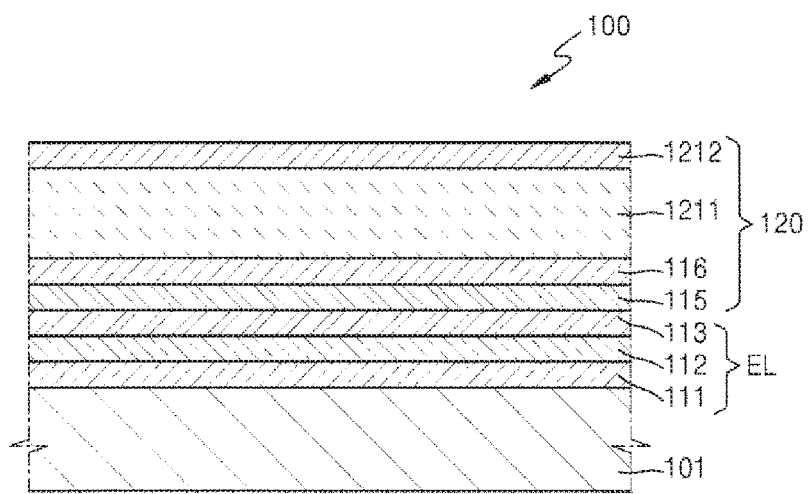
FIG. 2 is an enlarged cross-sectional view of a portion A of FIG. 1.

FIG. 1 is a cross-sectional view schematically illustrating an organic light emitting display apparatus according to an embodiment of the present invention; and FIG. 2 is an enlarged cross-sectional view of a portion A of FIG. 1.

Referring to FIG. 1, the organic light emitting display apparatus 100 according to the present embodiment includes a substrate 101, an organic light emitting portion 110, and an encapsulation portion 120. The organic light emitting portion 110 is formed as an organic light emitting device and is provided on the substrate 101. The substrate 101 may be formed not only of a glass member but also of various plastic members such as acryl, or further a metal plate. Also, the substrate 101 may be a low-temperature polycrystalline silicon (LTPS) substrate. A buffer layer (not shown) may be further provided on the substrate 101, if necessary.

As shown in FIG. 2, the organic light emitting portion 110 may include a plurality of organic light emitting devices EL.

Each organic light emitting device EL includes a first electrode 111, an intermediate layer 112, and a second electrode 113.

The first and second electrodes 111 and 113, respectively, may be used as an anode electrode and a cathode electrode, respectively. The first and second electrodes 111 and 113, respectively, may be used as the cathode electrode and the anode electrode, respectively.

When the organic light emitting display apparatus 100 is of a bottom emission type in which an image is presented in a direction toward the substrate 101, the first electrode 111 and the second electrode 113 are a transparent electrode and a reflective electrode, respectively. In another embodiment, when the organic light emitting display apparatus 100 is of a top emission type in which an image is presented in a direction toward the encapsulation portion 120, the first electrode 111 and the second electrode 113 are a reflective electrode and a transparent electrode, respectively.

The transparent electrode may contain at least one selected from a group consisting of indium tin oxide (ITO), indium zinc oxide (IZO), zinc oxide (ZnO), indium oxide ($In_2O_3$), indium gallium oxide (IGO), and aluminum zinc oxide (AZO).

The reflective electrode may be formed by thinly depositing metal having a low work function, for example, Ag, Mg, Al, Pt, Pd, Au, Ni, Nd, Ir, Cr, Li, Ca, LiF/Ca, LiF/Al, or a compound thereof.

One surface of the first electrode 111 may be exposed by a pixel define layer. The pixel define layer may be formed, by a method such as spin coating, of at least one organic insulation material selected from a group consisting of polyimide, polyamide, acryl resin, benzocyclobutene, and phenol resin. The pixel define layer may be formed of not only the above-described organic insulation material, but also an inorganic insulation material selected from a group consisting of $SiO_2$, $SiN_x$, $Al_2O_3$, $CuO_x$, $Tb_4O_7$, $Y_2O_3$, $Nb_2O_5$, and $Pr_2O_3$. Also, the pixel define layer may be formed in a multilayer structure in which the organic insulation material and the inorganic insulation material are alternately arranged.

The intermediate layer 112 is provided between the first and second electrodes 111 and 113, respectively. The intermediate layer 112 may be formed by stacking at least one functional layer of an emissive layer (EML), a hole transport layer (HTL), a hole injection layer (HIL), an electron transport layer (ETL), and an electron injection layer (EIL) in a single or composite structure.

The EML may be formed of a low molecular or polymer organic material. When the EML is formed of a low molecular organic material, in the intermediate layer 112, an HTL and an HIL are stacked in a direction toward the first electrode 111 and an ETL and an EIL are stacked in a direction toward the second electrode 113, with respect to the EML. A variety of layers may be additionally stacked if necessary. A variety of organic materials, such as copper phthalocyanine (CuPc), N,N'-Di(naphthalene-1-yl)-N,N'-diphenyl-benzidine (NPB), tris-8-hydroxyquinoline aluminum ($Alq_3$), etc., may be used therefor.

When the EML is formed of a polymer organic material, in the intermediate layer 112, only an HTL is included in a direction toward the first electrode 111 with respect to the EML. The HTL may be formed above the first electrode 111 by a method of inkjet printing or spin coating using poly(3,4-ethylenedioxythiophene) (PEDOT), polyaniline (PANI), etc. A polymer organic material, such as a polyphenylene vinylene (PPV) based material and a polyfluorene based material, may be used as the organic material. A color pattern may be formed by a typical method such as inkjet printing, spin coating, or a thermal transfer method using laser.

The encapsulation portion 120 of FIG. 1 encapsulates the organic light emitting portion 110. As shown in FIG. 2, the encapsulation portion 120 is formed by stacking porous layers 115 and 116, a planarization layer 1211, and a barrier layer 1212.

The porous layers 115 and 116 are formed above the second electrode 113. The porous layers 115 and 116 may be formed in a double layer as illustrated in FIG. 2. That is, the porous layers 115 and 116 may be formed of the first porous layer 115 and the second porous layer 116 stacked on the second electrode 113.

The porous layers 115 and 116 may be formed of an inorganic material. For example, the first porous layer 115 may be formed of LiF and the second porous layer 116 may be formed of $AlO_x$, $Al_2O_3$, $SiN_x$, $Si_3N_4$, ZnO, ZrO, or Al-doped zinc oxide (AZO). The second porous layer 116 may be formed by sputtering, atomic layer deposition (ALD), chemical vapor deposition (CVD), etc. The first porous layer 115 may protect the intermediate layer 112 from plasma damage or ultraviolet damage by a process for forming the second porous layer 116. In a modified example of the present invention, when the porous layers 115 and 116 are formed as a single layer, the porous layers 115 and 116 may be formed of LiF.

The porous layers 115 and 116 have a structure having a plurality of tiny holes therein. The porous layers 115 and 116 may delay generation of dark spots which are generated as impurities, such as moisture, oxygen, etc. generated from the planarization layer 1211 or intruding from the outside of the organic light emitting display apparatus 100, are concentrated at a part of the inside of the porous layers 115 and 116.

The planarization layer 1211 may be formed of an organic material, for example, acrylate, silicon, silicon acrylate, epoxy, epoxy acrylate, etc. The planarization layer 1211 formed of acrylate may be formed by a thermal deposition method. The planarization layer 1211 may be formed so as to be thicker than the barrier layer 1212.

The barrier layer 1212 may be formed of an inorganic material, for example, $AlO_x$, $Al_2O_3$, $SiN_x$, $Si_3N_4$, ZnO, ZrO, or Al-doped zinc oxide (AZO). The barrier layer 1212 may be formed of the above materials in two or more layers. The barrier layer 1212 may be formed by a method such as thermal evaporation, E-beam evaporation, RF sputtering, reactive sputtering, atomic layer deposition (ALD), etc.

Figure 3:
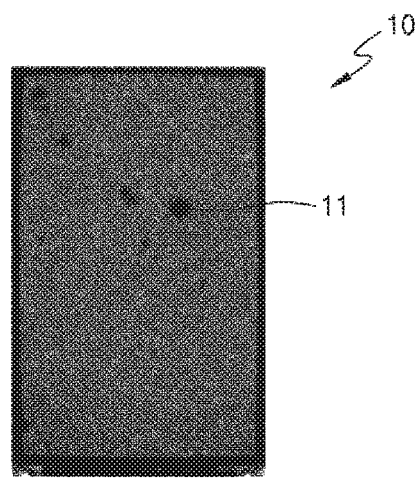
FIG. 3 is an image of an organic light emitting display apparatus in which progressive dark spots are revealed.

FIG. 3 is an image of an organic light emitting display apparatus in which progressive dark spots are revealed.

FIG. 3 shows a dark spot 11 that is generated in a conventional organic light emitting display apparatus 10 having a multilayer thin film encapsulation layer in which an organic layer and an inorganic layer are stacked on a buffer layer without the porous layers 115 and 116 of FIG. 2. As illustrated in FIG. 3, in the conventional organic light emitting display apparatus 10, impurities such as moisture or oxygen in an organic layer are concentrated at a scratch or a gap formed in an inorganic layer arranged under the organic layer. As the impurities gather in the scratch or gap, the dark spot 11 gradually increases and becomes a progressive dark spot. As the progressive dark spot is revealed, the life of the organic light emitting display apparatus 10 may be shortened.

According to the present invention, the porous layers 115 and 116 of FIG. 2 may prevent the concentration of impurities generated from the planarization layer 1211 or intruding from the outside at a part of the porous layers 115 and 116 by diffusing the impurities into the porous layers 115 and 116 through the tiny holes formed therein. Accordingly, the revelation of progressive dark spots due to the impurities is delayed so that the life of the organic light emitting display apparatus 100 may be extended.

Figure 4:
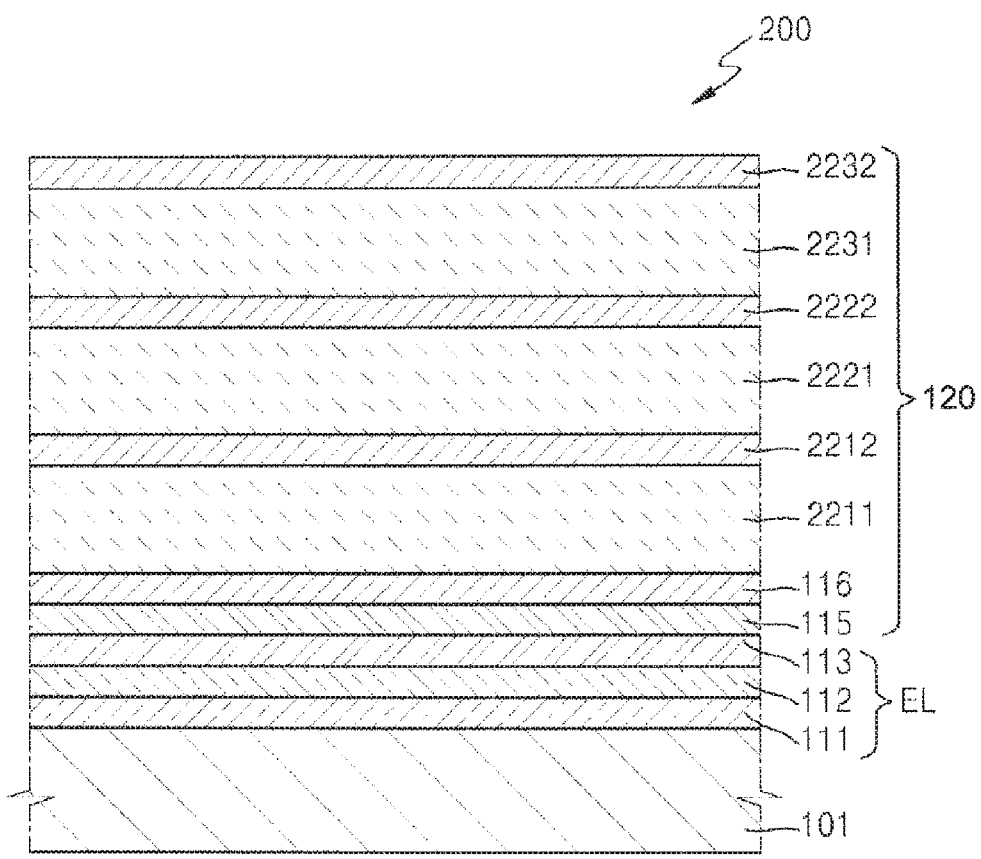
FIG. 4 is a cross-sectional view schematically illustrating an organic light emitting display apparatus according to another embodiment of the present invention.

FIG. 4 is a cross-sectional view schematically illustrating an organic light emitting display apparatus according to another embodiment of the present invention.

Referring to FIG. 4, the organic light emitting display apparatus 200 is different from the organic light emitting display apparatus 100 of FIG. 2 in that the organic light emitting display apparatus 200 includes an encapsulation portion 220 of a multilayer structure. That is, the organic light emitting display apparatus 200 of FIG. 4 includes the encapsulation portion 220 in which a first planarization layer 2211 and a first barrier layer 2212 are deposited above the porous layers 115 and 116, a second planarization layer 2221 and a second barrier layer 2222 are deposited above the first barrier layer 2212, and a third planarization layer 2231 and a third barrier layer 2232 are deposited above the second barrier layer 2222. The present invention is not limited to the above structure and the encapsulation portion 220 may have a structure in which at least one pair of a planarization layer and a barrier layer is stacked.

The porous layers 115 and 116 prevent impurities generated from the first to third planarization layers 2211, 2221, and 2231, respectively, from intruding into the organic light emitting devices EL, and diffuse the impurities into the porous layers 115 and 116. Thus, the revelation of progressive dark spots generated as the impurities are concentrated at a part of the porous layers 115 and 116 is delayed as much as possible so that the life of the organic light emitting display apparatus 200 may be extended.

As described above, according to the present invention, the revelation of progressive dark spots that may be generated at the encapsulation portion is delayed so that the life of the organic light emitting display apparatus may be extended.

While this invention has been particularly shown and described with reference to exemplary embodiments thereof, it will be understood by those skilled in the art that various changes in form and detail may be made therein without departing from the spirit and scope of the invention as defined by the appended claims.

What is claimed is:

1. An organic light emitting display apparatus, comprising:
   a substrate;
   an organic light emitting portion including a plurality of organic light emitting devices disposed on the substrate; and
   an encapsulation portion encapsulating the organic light emitting portion; wherein the encapsulation portion comprises:
   a porous layer on the organic light emitting portion;
   a planarization layer on the porous layer; and
   a barrier layer on the planarization layer.

2. The organic light emitting apparatus of claim 1, wherein the porous layer is interposed between the planarization layer and the substrate.

3. The organic light emitting apparatus of claim 1, wherein the porous layer is interposed between the planarization layer and each of the substrate and the organic light emitting portion.

4. The organic light emitting apparatus of claim 1, wherein:
the porous layer includes a plurality of holes; and
the planarization layer is non-porous.

5. The organic light emitting apparatus of claim 1, wherein the planarization layer comprises an organic material selected from a group consisting of acrylate, silicon acrylate, epoxy and epoxy acrylate.

6. The organic light emitting apparatus of claim 1, wherein:
the porous layer includes a plurality of pores; and
the barrier layer comprises a material selected from a group consisting of $AlO_x$, $Al_2O_3$, $SiN_x$, $Si_3N_4$, ZnO, ZrO, and Al-doped zinc oxide (AZO).

7. The organic light emitting apparatus of claim 1, wherein:
the porous layer is a single layer: and
the porous layer includes LiF.

8. The organic light emitting apparatus of claim 1, wherein the porous layer comprises a first porous layer and a second porous layer that are stacked above the organic light emitting portion.

9. The organic light emitting apparatus of claim 8, wherein the first porous layer includes LiF.

10. The organic light emitting apparatus of claim 8, wherein the second porous layer includes $AlO_x$.

11. The organic light emitting apparatus of claim 1, wherein:
the planarization layer comprises a first planarization layer and a second planarization layer; and
the barrier layer is disposed between the first planarization layer and the second planarization layer.

12. The organic light emitting apparatus of claim 1, wherein the organic light emitting device comprises:
a first electrode on the substrate;
an intermediate layer on the first electrode and emitting light; and
a second electrode covering the intermediate layer.

13. The organic light emitting apparatus of claim 1, wherein the planarization layer comprises a different material than that of the porous layer, and the barrier layer comprises a different material than any of the planarization layer and the porous layer.

14. An encapsulation layer covering a display element on a substrate, comprising:
a porous layer on the display element;
a planarization layer on the porous layer; and
a barrier layer on the planarization layer.

15. The encapsulation layer of claim 14, wherein the porous layer is interposed between the planarization layer and the substrate.

16. The encapsulation layer of claim 14, wherein the porous layer is interposed between the planarization layer and each of the substrate and the display element.

17. The encapsulation layer of claim 14, wherein:
the porous layer includes a plurality of holes; and
the planarization layer is non-porous.

18. The encapsulation layer of claim 14, wherein the planarization layer comprises an organic material selected from a group consisting of acrylate, silicon acrylate, epoxy and epoxy acrylate.

19. The encapsulation layer of claim 14, wherein:
the porous layer has a plurality of pores; and
the barrier layer comprises a material selected from a group consisting of $AlO_x$, $Al_2O_3$, $SiN_x$, $Si_3N_4$, ZnO, ZrO, and Al-doped zinc oxide (AZO).

20. The encapsulation layer of claim 14, wherein:
the porous layer is a single layer; and
the porous layer includes LiF.

21. The encapsulation layer of claim 14, wherein the porous layer comprises a first porous layer and a second porous layer that are stacked above the display element.

22. The encapsulation layer of claim 21, wherein the first porous layer includes LiF.

23. The encapsulation layer of claim 21, wherein the second porous layer includes $AlO_x$.

24. The encapsulation layer of claim 14, wherein:
the planarization layer comprises a first planarization layer and a second planarization layer; and
the barrier layer is disposed between the first planarization layer and the second planarization layer.

25. The encapsulation layer of claim 14, wherein:
the planarization layer comprises a different material than that of the porous layer; and
the barrier layer comprises a different material than any of the planarization layer and the porous layer.

* * * * *